June 13, 1967 JAMES E. WEBB 3,325,749
ADMINISTRATOR OF THE NATIONAL AERONAUTICS
AND SPACE ADMINISTRATION
VARIABLE FREQUENCY OSCILLATOR WITH TEMPERATURE COMPENSATION
Filed March 11, 1966 2 Sheets-Sheet 1

INVENTOR.
DONALD C. MEAD
ELLIOTT D. LAWRENCE
BY
ATTORNEYS

INVENTORS
DONALD C. MEAD
ELLIOTT D. LAWRENCE
BY
[signature]
J. H. Warden
ATTORNEYS United States Patent Office 3,325,749

Patented June 13, 1967

3,325,749

VARIABLE FREQUENCY OSCILLATOR WITH TEMPERATURE COMPENSATION

James E. Webb, Administrator of the National Aeronautics and Space Administration, with respect to an invention of Donald C. Mead, Granada Hills, and Elliott D. Lawrence, Van Nuys, Calif.

Filed Mar. 11, 1966, Ser. No. 535,304

9 Claims. (Cl. 331—113)

ABSTRACT OF THE DISCLOSURE

A variable frequency solid state oscillator which provides an output frequency related to an input signal supplied through an input buffer stage. The buffer stage includes a field effect transistor (FET) connected between the source of input signal and the oscillator. The gate-source voltage properties of the FET as a function temperature are utilized to adjust the signal supplied to the oscillator so that its output frequency is substantially unaffected by temperature changes. The buffer stage is also used to raise the input impedance of the oscillator to above 10 megohms.

*Origin of invention*

The invention described herein was made in the performance of work under a NASA contract and is subject to the provisions of Section 305 of the National Aeronautics and Space Act of 1958, Public Law 85–568 (72 Stat. 435; 42 U.S.C. 4257).

This invention relates to oscillators and more particularly to an improved subcarrier oscillator.

Space exploration has led to the development of a great variety of devices which can be used to transmit information or data from a space vehicle or satellite to earth for interpretation or analysis. Among the devices are included circuits known as subcarrier oscillators which may be defined as circuits which produce output frequencies which are functions of input signals.

Generally in a telemetry system, a plurality of subcarrier oscillators is included. Each oscillator is designed to produce within an assigned bandwidth an output frequency as a substantially linear function of the magnitude of an input signal which is generally supplied from a device or transducer sensing a particular phenomenon. Since a telemetry system includes a great number of oscillators, it is advantageous that each oscillator be operable with a minimum of power so that the total power requirements of the system be as low as possible. Another important desired characteristic of a subcarrier oscillator is to minimize its sensitivity to temperature changes so that the output frequency be affected only by changes of the input signal rather than by environmental changes. It is also desirable that the input impedance of the oscillator be high so that the oscillator can be directly connected to the transducer providing the oscillator's input signal without materially affecting the transducer's output voltage.

Accordingly, it is an object of the present invention to provide an improved subcarrier oscillator.

Another object is the provision of a subcarrier oscillator which is characterized by low power requirements.

Still another object is to provide a low power subcarrier oscillator with an input impedance which is considerably higher than the input impedances characteristic of presently known subcarrier oscillators.

A further object is to provide a subcarrier oscillator whose output frequency is substantially independent of temperature changes within reasonable operating ranges.

Still a further object is the provision of a low power subcarrier oscillator which is temperature compensated so that the effect of temperature changes on the output frequency is minimized.

Yet a further object is to provide a low power temperature compensated subcarrier oscillator with a relatively high input impedance.

These and other objects are achieved in a subcarrier oscillator which includes an oscillator circuit to which the input signal is supplied through an input buffer stage designed to include a field effect transistor whose gate-source voltage properties as a function of temperature are utilized to adjust the signal supplied to the oscillator so that its output frequency of the oscillator is substantially unaffected by temperature changes. The buffer stage also includes resistive elements and a transistor connected so that the effective input impedance of the subcarrier oscillator is considerably above ten megohms, which is greater than the typical input impedances of prior art subcarrier oscillators. The power requirement of the subcarrier oscillator is optimized by using a minimum number of components.

The novel features that are considered characteristic of this invention are set forth with particularity in the appended claims. The invention itself both as to its organization and method of operation, as well as additional objects and advantages thereof, will best be understood from the following description when read in connection with the accompanying drawings, in which:

Figure 1:
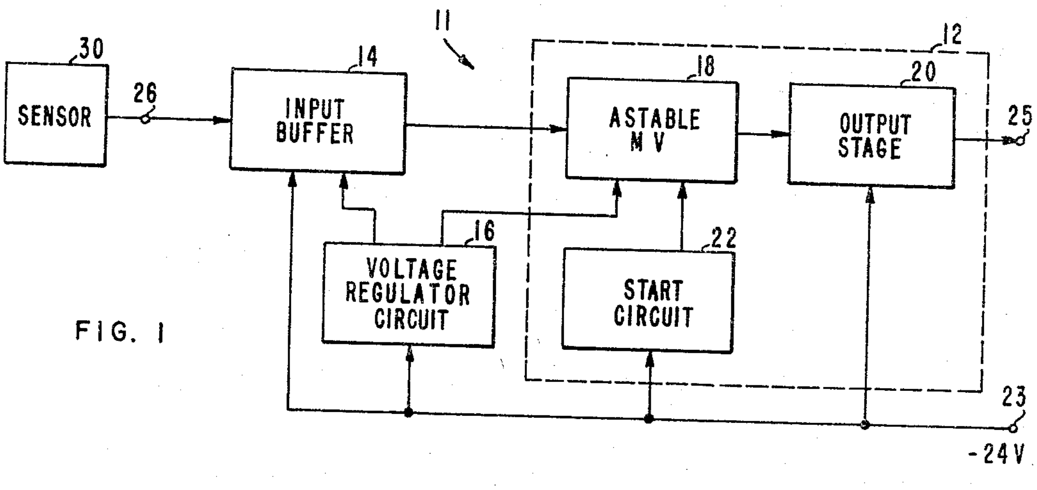
FIGURE 1 is a block diagram of the novel subcarrier oscillator.

Reference is now made to FIGURE 1 which is a simplified block diagram of the novel subcarrier oscillator of the present invention. As seen, the subcarrier 11 includes an oscillatory stage 12, an input buffer 14, and a voltage regulator circuit 16. The oscillatory stage 12 includes an astable multivibrator 18, an output stage 20, and a start circuit 22, with the stage 20 and the circuit 22 being connected to a terminal 23 which may be connected to a source of voltage such as −24 volts. The voltage regulator source 16 is also connected to terminal 23 to receive the −24 volts therethrough, with the output of circuit 16 being supplied to the input buffer 14 and to the astable multivibrator 18. The latter circuit also receives a starting signal from start circuit 22 while the output of the astable multivibrator is connected to the input of the output stage 20, the output of which is connected to an output terminal 25. The inputs and outputs of the input buffer stage 14 are respectively connected to an input terminal 26 and to the astable multivibrator 18.

In operation, the multivibrator 18 provides an output, the frequency of which is related to the input from the input buffer 14, which is inturn a function of the input supplied through terminal 26 such as from a sensing device or transducer 30, which may be thought of as a source of input signals. In order to minimize the affects of voltage irregularities and temperature changes on the output frequency of the astable multivibrator 18, the voltage regulator circuit 16 is designed to regulate the −24 volts supplied thereto through terminal 23 and supply the input buffer 14 and the astable multivibrator 18 with highly regulated temperature compensated voltages.

Also, the input buffer 14, as will be hereafter described in detail, includes a novel arrangement for compensating for the effect of temperature variations on the operation of the multivibrator 18 so that its output frequency is substantially only a function of the input signals from sensor 30. As is appreciated by those familiar with the art, the output of the multivibrator 18 is usually in the form of a square wave. This square wave output is supplied to the output circuit 20 which includes amplifying and filtering circuits to provide an output signal at output terminal 25 having predetermined sinusoidal characteristics of a frequency equal to the output frequency of multivibrator 18.

Figure 2:
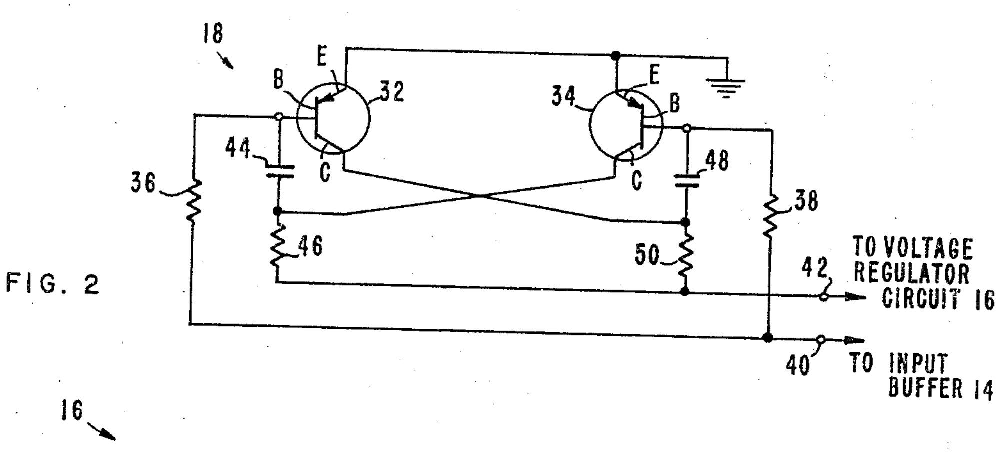
FIGURE 2 is a schematic diagram of the astable multivibrator shown in FIGURE 1.

Reference is now made to FIGURE 2 which is a schematic diagram of the astable multivibrator 18. As seen, it is a conventional astable multivibrator circuit 18 comprised of a pair of transistors 32 and 34 each having base, emitter and collector electrodes, designated by B, E, and C respectively. The emitter electrodes of the two transistors are connected to a point of reference potential such as ground, while the base electrodes of the two transistors are connected through resistors 36 and 38 to a terminal 40 which is in turn connected to the input buffer 14. Also the base electrode of transistor 32 is connected to a terminal 42 through serially connected capacitor 44 and resistor 46 with the junction therebetween being connected to the collector electrode of transistor 34. Similarly, the base electrode of transistor 34 is connected to terminal 42 through serially connected capacitor 48 and resistor 50, with the junction therebetween being connected to the collector electrode of transistor 32. Thus, the multivibrator 18 may be thought of as an astable multivibrator with the base and collector resistors returned to different supply voltages.

As is appreciated by those familiar with the art, the frequency of the voltage at the collector which has a square waveshape may be defined by the following expression:

$$f=\frac{1}{2RC\ln\left[\frac{V_B+V_C-V_{CEsat}-V_{BE}}{V_B-V_{BE}}\right]} \qquad (1)$$

where $V_B$, $V_C$, $V_{CEsat}$, $V_{BE}$, represent the base voltage, collector voltage, collector-to-emitter saturation voltage, and base-to-emitter voltage of the transistors 32 and 34, while R represents the resistive value of either resistor 36 or 38 and C represents the capacitive value of either capacitor 44 or 48, assuming equal resistive and capacitive component pairs.

When the magnitudes of $V_{CEsat}$ and $V_{BE}$ are small compared to $V_B$ and $V_C$, expression (1) reduces to:

$$f=\frac{1}{2RC\ln\left[1+\frac{V_C}{V_B}\right]} \qquad (2)$$

Thus, the frequency of the astable multivibrator can be controlled by varying either $V_B$ or $V_C$. However the frequency increases for more negative values of $V_B$ and decreases for more negative values of $V_C$. Since subcarrier oscillators used in standard telementry systems require increasing frequency with signal amplitude, in the present invention, $V_B$, supplied from the input buffer 14 (FIGURE 1) is used as the control voltage, while $V_C$ is a fixed temperature compensated regulated voltage supplied from the voltage regulator circuit 16.

In order to improve the performance of the oscillator, it is desirable that $V_B$ be considerably greater than $V_C$. The smaller the portion of the total exponential used in timing, the better the linearity. This is the reason for developing a small voltage from the voltage regulator circuit 16. On the other hand, $V_C$ cannot be too small or the output amplitude of the multivibrator 18 may be too small. In addition, small variations in $V_{CEsat}$ and $V_{BE}$ with temperature would cause proportional greater changes in the output frequency of the multivibrator. It is important that the collector voltage $V_C$ be highly regulated since transients on this supply voltage would cause substantial frequency shifts.

Figure 3:
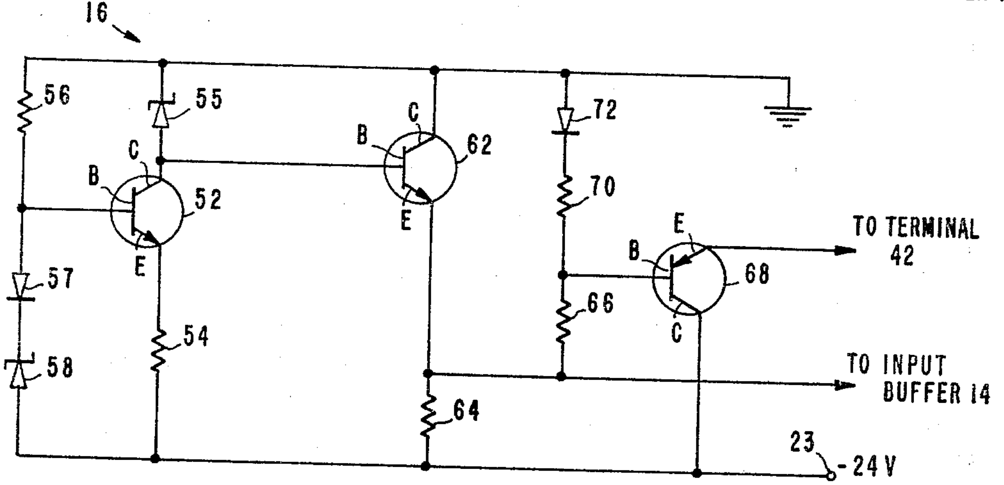
FIGURE 3 is a schematic diagram of the voltage regulator circuit shown in FIGURE 1.

Reference is now made to FIGURE 3 which is a schematic diagram of the voltage regulator circuit 16, shown comprised of a transistor 52 having its emitter electrode E connected to the −24 volts through a resistor 54 while the collector electrode C of the transistor is connected through a temperature compensated Zener diode 55 to the ground potential reference. The base electrode B of the transistor is connected through a resistor 56 to the ground potential and through serially connected diode 57 and a temperature compensated diode 58 to the terminal 23 through which the −24 voltage is supplied. Although Zener diodes are extensively used in the prior art to regulate input voltages, it has been found that by using the arrangement shown in FIGURE 3 the voltage at the collector electrode of transistor 52 can be highly regulated and maintained at a constant value irrespective of considerable changes in the −24 input voltage.

The collector current which is the same as the current in Zener diode 55 can be accurately controlled by adjusting the resistance of resistor 54 and thereby achieving an optimum temperature coefficient. As seen from FIGURE 3, the collector electrode of transistor 52 is connected to the base electrode BE of a transistor 62, the collector electrode C of which is connected to the ground reference potential, with the emitter electrode E thereof being connected to terminal 23 through a resistor 64. The emitter electrode E of transistor 62 is connected to the input buffer 14 to provide a regulated voltage thereto, as well as to one end of a resistor 66, the other end of which is connected to a base electrode B of a transistor 68 and to a resistor 70. A diode 72 is connected between the other end of resistor 70 and the reference ground potential. The collector electrode C of transistor 68 is connected to the −24 volts while the emitter electrode E thereof is connected to terminal 42 (FIGURE 2) to provide a regulated, temperature compensated collector voltage for transistors 32 and 34 of the astable multivibrator 18.

As seen from FIGURE 3, the emitter electrode of transistor 62 goes to the input buffer and is uncompensated by one diode temperature coefficient, the diode being that designated by reference numeral 72. The voltage to the base electrode B of transistor 68 is reduced by the voltage division accomplished by resistors 66 and 68. The voltage to the base electrode and therefore the voltage at the emitter electrode E of transistor 68 is made to be quite small so that the value $V_C$ as herebefore described is controlled to be small for the reasons hereinbefore given. The function of diode 72 placed in series with resistor 70 is to compensate for the base emitter temperature coefficient of transistor 68, thereby controlling the emitter voltage of transistor 68 to be almost completely independent of temperature variations, i.e. provide an almost completely temperature compensated $V_C$ voltage to the astable multivibrator.

Figure 4:
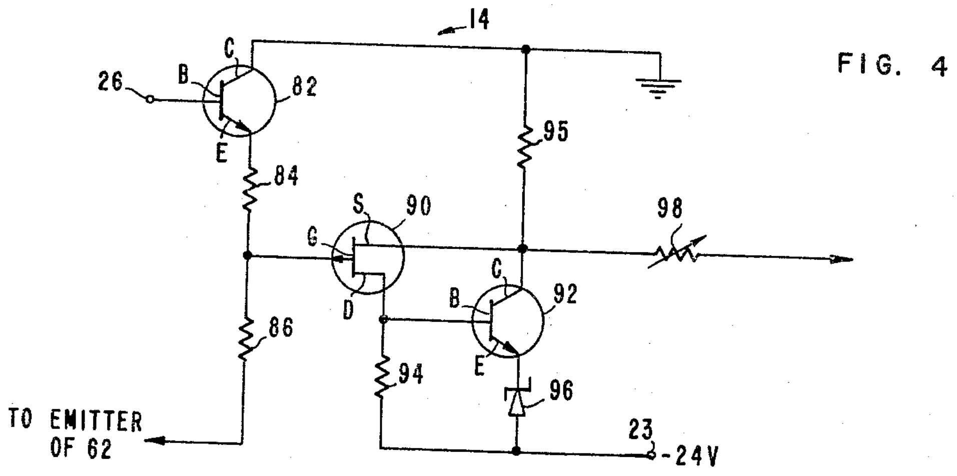
FIGURE 4 is a schematic diagram of the input buffer shown in FIGURE 1.

Reference is now made to FIGURE 4 which is a schematic diagram of the input buffer 14 (FIGURE 1), the function of which is to receive input signals via input terminal 26 from sensor 30 and provide temperature compensated signals to multivibrator 18. As seen from FIGURE 4, the input buffer includes a transistor 82 having its base electrode connected to input terminal 26 with the collector electrode connected to the ground potential reference. The emitter electrode of transistor 82 is connected through serially connected resistors 84 and 86 to the emitter electrode of transistor 62 which forms a part of the voltage regulator circuit 16 (FIGURE 3) as herebefore described. The junction between resistors 84 and 86 is connected to a gate electrode G of a field effect transistor 90. A drain electrode D of the transistor 90 is connected to a base electrode of a transistor 92 as well as to the source of −24 volts through a resistor 94. The source electrode S of transistor 90 is connected to the ground potential reference through a resistor 95 and to the collector electrode of transistor 92, with the emitter electrode of transistor 92 being connected to the source of −24 volts through a Zener diode 96. The source electrode of field effect transistor 90 and the collector electrode of transistor 92 are connected through a variable resistor 98 to the terminal 40 of the astable multivibrator 18 (FIGURE 2), through which the base voltage $V_B$ is supplied to the multivibrator.

Briefly, the input buffer 14 is designed to perform two basic functions. One function is to condition the input signal supplied to terminal 26 from the sensor 30 to the proper level and temperature coefficient, so that the signal supplied to the multivibrator through adjustable resistor 98 from the input buffer controls the output frequency of the multivibrator to be substantially a function of the input signal from the sensor and practically independent of temperature variation within a predetermined temperature range. Also the input buffer 14, by including the transistor 82, accounts for a high input impedance of the oscillator resulting in a minimum current loading of the sensor 30. Referring again to expression (1), it is seen that the frequency is a function of various voltage levels in the astable multivibrator. By differentiating this expression with respect to the base voltage $V_B$, one obtains the expression:

$$\frac{\partial f}{\partial V_B}=\frac{1}{2RC}\left[\frac{V_C-V_{CEsat}}{(V_B-V_{BE})(V_B+V_C-V_{CEsat}-V_{BE})}\right]\left[\frac{1}{\ln\left(\frac{V_B+V_C-V_{CEsat}-V_{BE}}{V_B-V_{BE}}\right)}\right]^2 \quad (3)$$

Substituting expression (1) into expression (3), $\partial f/\partial V_B$ may be expressed as:

$$\frac{\partial f}{\partial V_B}=f\left[\frac{V_C-V_{CEsat}}{(V_B-V_{BE})(V_B+V_C-V_{CEsat}-V_{BE})}\right]\left[\frac{1}{\ln\left(\frac{V_B+V_C-V_{CEsat}-V_{BE}}{V_B-V_{BE}}\right)}\right] \quad (4)$$

For small changes in $V_B$ about the center frequency base voltage, $V_B$, the frequency change will be linear and $$\frac{\partial f}{\partial V_B}=\frac{\Delta f}{\Delta V_B} \quad (5)$$

Knowing the desired bandwidth then permits the determination of the necessary base voltage change sensitivity.

The voltage appearing at the gate electrode G of the field effect transistor 90 is a function of the input signal at terminal 26 from sensor 30, the voltage at the emitter electrode of transistor 62 (FIGURE 3) and the resistive voltage divider, comprising of resistors 84 and 86. The voltage at the emitter electrode of transistor 62 is essentially constant and for fixed values of resistors 84 and 86, the voltage at the gate electrode of transistor 90, hereafter referred to as the gate voltage, is then a function of the input signal voltage at terminal 26 hereafter designated by $V_S$. For minimum current loading of the sensor 30, the total emitter resistance may be selected as high as one megohm. With a conservative D.C. beta for transistor 82 of thirty, the input impedance of the device may be as large as thirty megohms. This corresponds to a sensor load current of less than 250 nanoamperes. Thus, by utilizing transistor 82 and the resistive divider of resistors 84 and 86, the input impedance of the novel subcarrier oscillator of the present invention can be made as large as thirty megohms, a value considerably greater than the typical input impedance of prior art subcarrier oscillators.

Assuming that the gate source voltage of field effect transistor 90 to be constant, at constant temperature, the change in the voltage at the source electrode S of transistor 90 which may also be thought of as the base voltage $V_B$ in the multivibrator will be the same as the change in the gate voltage $V_G$. The change in gate voltage $V_G$ is related to the change in the sensor input voltage at the input terminal 26 $V_S$ by the expression:

$$\Delta V_B=\Delta V_G=\left(\frac{R_{86}}{R_{84}+R_{86}}\right)\Delta V_S \quad (6)$$

where $R_{84}$ and $R_{86}$ represent the resistive values of resistors 84 and 86 respectively. For a particular bandwidth of the subcarrier oscillator, the value $\Delta V_B$ can be evaluated from expression (4). The values of resistors 84 and 86 can then be determined. The voltage $V_B$, applied to the base circuit of the astable multivibrator 18, is the gate voltage $V_G$ of field effect transistor 90 plus the gate-to-source voltage thereof. The gate-to-source voltage of the field effect transistor is essentially a function of the drain current for drain-to-source voltages greater than the pinch-off level. In the novel arrangement of the present invention shown in FIGURE 4, the Zener diode 96 in the emitter circuit of transistor 92 provides a reference voltage, allowing the drain current to be controlled by controlling the resistive value of resistor 94.

When selecting the field effect transistor 90 to be used in the input buffer 14 of the novel subcarrier oscillator of the present invention, the following two parameters need to be carefully considered: (1) the pinch-off voltage, designated $V_P$; (2) drain current at zero gate-source voltage designated $I_{DSS}$. Contrary to the desired amplifier characteristics for a field effect transistor, the pinch-off voltage in the present invention should be large. This provides a large base voltage $V_B$, applied to the astable multivibrator 18 with the resulting improvement in frequency linearity with respect to input signal. The drain current, $I_{DSS}$, is a function of the device geometry and is chosen to give the desired gate-source temperature coefficient at a particular drain current. The temperature coefficient that will give zero change in frequency over the operating temperature range is the value desired. The range over which the temperature coefficient may be varied for a P-channel field effect transistor is given by the following expression:

$$\frac{dV_{GS}}{dT}=\frac{dV_P}{dT}-\frac{nV_P}{2T}\sqrt{\frac{I_D}{I_{DSS}}} \quad (7)$$

where $$dV_P/dT \quad (8)$$

is approximately two millivolts/° C., and $n$ being an empirical constant approximately equal to two and T is in degrees Kelvin.

The amount of temperature correction that need be supplied by the field effect transistor 90 can be minimized by using temperature stable metal film resistors and glass capacitors. The effective diode temperature coefficient of the gate electrode field effect transistor 90 (FIGURE 4) compensates to a good approximation the base-emitter voltage variations of the two transistors 32 and 34 of the astable multivibrator 18 (FIGURE 2). On the other hand, the resistive value of drain resistor 94 (FIGURE 4) is selected to compensate for the collector-emitter saturation voltage variations of the transistors 32 and 34, the mismatch in the diode and base emitter temperature coefficients and the residual component variations with temperature. A simple experimental technique for selecting the optimum value of drain resistor 94 is to plot the desired center frequency of the oscillator against the resistive value of resistor 94 with temperature as a parameter.

Figure 5:
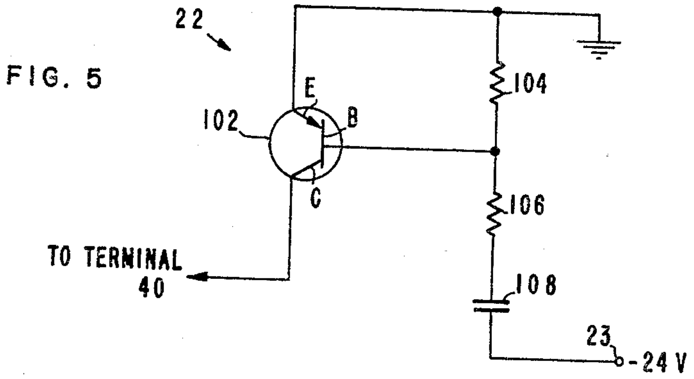
FIGURE 5 is a schematic diagram of the start circuit shown in FIGURE 1.

In order to insure proper starting of the astable mutlivibrator 18, the subcarrier oscillator of the present invention includes the start circuit 22 (FIGURE 1) which is schematically diagrammed in FIGURE 5 to which reference is made herein. The start circuit includes a transistor 102 having its emitter electrode connected to the ground potential reference and its collector electrode connected to terminal 40 (FIGURE 2) of the astable mutlivibrator 18. The base electrode of transistor 102 is connected to the junction point of resistors 104 and 106, with the other end of resistor 104 connected to the ground potential reference and the other end of resistor 106 connected to the terminal 23 of the —24 volts supply through a capacitor 108.

In actuality, transistors 32 and 34 of multivibrator 18 and their base resistors 36 and 38 respectively are also a part of the start circuit 22.

In order to assure starting when power is applied, it is necessary for the astable multivibrator timing capacitors 44 and 48 to become fully charged by the collector supply, before the base voltage is applied. When the oscillator is turned on, transistor 102 is saturated and clamps the base voltage, $V_B$, at ground reference potential through $R_{98}$ (FIGURE 4). After capacitors 44 and 48 have become fully charged, transistor 102 is cut off and unloads the base voltage line, allowing the circuit to operate. The time that transistor 102 is held on is determined by the time constant of resistor 106 and capacitor 108. The ratio of the resistance of resistor 104 to the resistance of resistor 106 is kept small so that transients on the supply voltage will not cause transistor 102 to begin saturating during normal operation.

In reducing the teachings of the present invention to practice, it has been found that in response to an unregulated input supply voltage of ±22 to ±32 volts and an input signal from source 30 varying between 0 to +5 volts or —5 volts depending upon input power supply polarity, the input signal voltage to output frequency transfer characteristic was liner to ±0.1% of the oscillator's bandwidth. The input power requirement was less than 125 milliwatts and the input impedance was greater than ten megohms at the center frequency. The center frequency was stable to ±0.4% over a temperature range —20° C. to +70° C. but within ±0.5% over all conditions.

Figure 6:
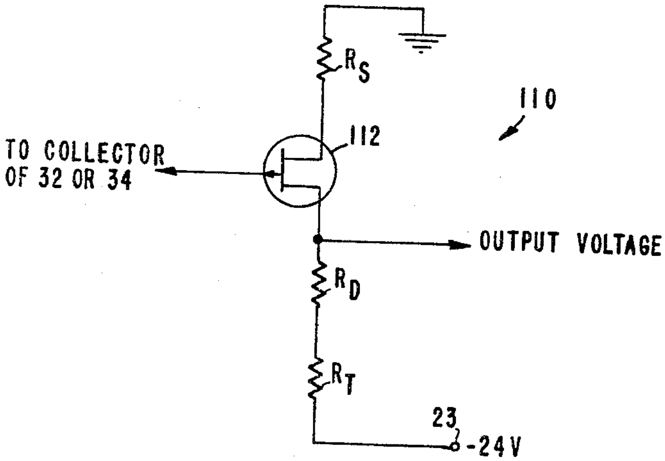
FIGURE 6 is a schematic diagram of the amplifier forming a part of an output stage shown in FIGURE 1.

As is appreciated by those familiar with the art, the output of the astable multivibrator 18, which is assumed to be the collector voltage at one of the transistors thereof has a square waveshape and is of a relatively low amplitude. In order to increase the amplitude of the output signal of the subcarrier oscillator of the present invention, as well as eliminate the need for symmetrical loading of the multivibrator's collectors, a field effect transistor amplified as schematically diagrammed in FIGURE 6 to which reference is made herein, is used. The amplifier is assumed to form a part of the output stage 20 shown in FIGURE 1. The amplifier includes a field effect transistor 112 having its gate electrode connected to the collector of either transistor 32 or transistor 34 of the multivibrator 18 (FIGURE 2). The source electrode of field effect transistor 112 is connected to ground potential reference through a resistor $R_S$ while the drain electrode of the transistor is connected through serially connected resistors $R_D$ and $R_T$ to the terminal 23 to which the source of —24 voltage is coupled. The high input impedance of the junction field effect transistor does not load the output collector with the degradation in frequency linearity that might otherwise occur. Thus the need to symmetrically load the collectors of the multivibrator 18 is eliminated. The gain provided by amplifier 110 may be expressed as:

$$A_V \cong \frac{g_m(R_D+R_T)}{1+g_m R_S} \qquad (9)$$

Resistor $R_T$ is a temperature sensitive resistor, such as a sensistor, and is used to minimize the output voltage variation due to temperature. The magnitude of the output voltage taken as the drain voltage of transistor 112 is set at the desired output level by varying the resistance of resistor $R_D$. Thus, amplifier 110, in addition to providing the desired amplification of the collector voltage or output of the multivibrator 18, also eliminates the need for symmetrical loading of the astable collectors.

Since in most communication applications, the output of each subcarrier oscillator used therein is sinusoidal, and since the amplified output of amplifier 110 is still a square wave, it need be filtered to a sinusoid having a harmonic distortion level low enough to prevent loss of power in unwanted sidebands transmitted by the communications link. A total harmonic distortion level below one percent is generally considered sufficient. At low frequencies, below approximately ten kilocycles, the size of the passive inductors providing adequate Q becomes incompatible with the size and weight requirements of filters for space vehicles. In order to provide proper filtering at these frequencies, active RC networks are utilized. However, for frequencies above ten kilocycles, small high Q inductors can be obtained which lend themselves for conventional LC filtering arrangements. Any one of presently known filtering techniques whether active or passive networks may be employed to convert the square wave output voltage of amplifier 110 to a sinusoidal having the desired harmonic distortion level. It is appreciated however that regardless of the filtering arrangement used, the frequency of the sinusoidal output signal is the same as the frequency of the output of the astable multivibrator, which is controlled by the signals supplied thereto from the sensor 30 through the novel input buffer hereinbefore described in conjunction with FIGURE 4.

In one actual reduction to practice of a subcarrier oscillator with a center frequency of 14.5 kilocycles, the components listed in the following table were used.

| Figure | Component | Type |
|---|---|---|
| 3 | FET 90 | Selected 2N2608 (SU316). |
| 6 | FET 112 | Selected 2N2608 (SU316). |
| 2 | Transistor 32 | 2N2946. |
| 2 | Transistor 34 | 2N2946. |
| 3 | Transistor 52 | 2N2484. |
| 3 | Transistor 62 | 2N2484. |
| 3 | Transistor 68 | 2N2838. |
| 4 | Transistor 82 | 2N2484. |
| 4 | Transistor 92 | 2N2484. |
| 5 | Transistor 102 | 2N2838. |
| 3 | Zener Diode 55 | FSP 358-1. |
| 3 | Zener Diode 58 | FSP 358-1. |
| 4 | Zener Diode 96 | 1N1313. |
| 3 | Diode 57 | FD 300. |
| 3 | Diode 72 | FD 300. |
| 2 | Resistor 36 | 174K, metal film. |
| 2 | Resistor 38 | Do. |
| 2 | Resistor 46 | 6.19K, 1% carbon film. |
| 2 | Resistor 50 | Do. |
| 3 | Resistor 54 | 169K, metal film. |
| 3 | Resistor 56 | Do. |
| 3 | Resistor 64 | 57.6K, 1% carbon film. |
| 3 | Resistor 66 | 13.3K, metal film. |
| 3 | Resistor 70 | 16.2K, metal film. |
| 4 | Resistor 84 | Adjusted for proper frequency deviation, metal film. |
| 4 | Resistor 86 | 392K, metal film. |
| 4 | Resistor 94 | Adjusted for proper oscillator temperature compensation, metal film. |
| 4 | Resistor 95 | 16.2K. |
| 4 | Resistor 98 | Adjusted for correct center frequency, metal film. |
| 5 | Resistor 104 | 2.2K, Carbon composition 5%. |
| 5 | Resistor 106 | 10K, Carbon composition 5%. |
| 6 | $R_S$ | 6.49K, 1%. |
| 6 | $R_D$ | Related |
| 6 | $R_T$ | Sensistor 680Ω. |
| 2 | Capacitor 44 | 510 pf., 1%. |
| 2 | Capacitor 48 | 510 pf., 1%. |
| 5 | Capacitor 108 | 1μf, 50 v. |

Despite fluctuations in the input supply voltage from —22 to —32 volts, the output frequency of the amplifier 110 (FIGURE 6) as a function of input signals varying from 0 to —5 volts was linear within ±1% of the oscillator's bandwidth. Also the center frequency at 14.5 kilocycles was stable to within 0.5% over a temperature range varying from —20° C. to +70° C. The output voltage of the amplifier 110 was then filtered to provide a sinusoidal output signal with an output harmonic distortion of less than 1%.

The foregoing actual reduction to practice has been presented for explanatory purposes only, rather than as a limitation on the teachings disclosed herein. Furthermore, although in the foregoing the invention has been described in connection with a negative power supply input voltage, it should be appreciated that the teachings are similarly applicable to circuits using positive supply voltages. For operation with a positive supply voltage, the complementary circuit configuration is required, i.e. NPN transistors become PNP transistors and vice versa, P-channel field effect transistors become N-channel field effect transistors and all diode polarities are reversed. Operation of the only resistors which need be adjusted for proper operation of the subcarrier oscillators are resistor 84 (FIGURE 4) which is adjusted for the proper frequency deviation, i.e. proper bandwidth, resistor 98 (FIGURE 4) adjusted for correct center frequency and drain resistor 94 which is adjusted for oscillator temperature compensation. Thus the problem of adjusting or trimming the subcarrier oscillator so that it operates in the desired bandwith and having the desired center frequency is greatly minimized.

Summarizing briefly, the subcarrier oscillator of the present invention includes an astable multivibrator which comprises of a pair of transistors regeneratively coupled and an input buffer stage which provides temperature compensated base voltage supplied to the transistors of the astable multivibrator as a function of input signals from a source of signals such as a sensing transducer so that the multivibrator is temperature compensated and its output frequency is substantially only a function of the input signals. Basically the input buffer includes a field effect transistor with the input signal supplied to its gate electrode with the source electrode coupled to the base electrodes of the multivibrator transistors. The drain electrode is connected to an adjustable drain-current-control circuit which is adjusted to compensate for the collector-emitter saturation voltage variations of the multivibrator as well as to compensate for the mismatch in the diode and base-emitter temperature coefficients and the residual component variations with temperature. Thus the field effect transistor in the input buffer can be thought of as a solid state temperature compensating element.

The input buffer also includes a transistorized arrangement which accounts for the high input impedance of the subcarrier oscillator thereby minimizing the current loading of the source of input signals. The subcarrier oscillator also includes a voltage regulator circuit, the function of which is to regulate the input supply voltage to provide temperature compensated collector voltage to the multivibrator transistors. The voltage regulator circuit also provides a regulated voltage for the input buffer unit.

The subcarrier oscillator may also include an output amplifier and filter stage to amplify the square shaped collector voltage of one of the multivibrator's transistors and filter it to a sinusoidal frequency with a harmonic distortion level below a predetermined level.

It is appreciated that those familiar with the art may make modifications in the arrangements as shown without departing from the true spirit of the invention. Therefore, all such modifications and/or equivalents are deemed to fall within the scope of the appended claims.

What is claimed is:

1. A subcarrier oscillator for providing an output frequency as a function of the amplitude of an input signal from a source of input signals;

first oscillatory means for providing an output frequency as a function of a voltage input signal supplied thereto; and input buffer means disposed between said first oscillatory means and said source of input signals, including a discrete component having predetermined adjustable temperature sensitivity properties for receiving the input signal from said source and providing said voltage input signal to said first oscillatory means whereby the output frequency is substantially unaffected by temperature changes, said discrete component being a field effect transistor having gate, source and drain electrodes, means for connecting said source electrode to said first oscillatory means to supply said voltage input signal thereto, input means for connecting said gate electrode to said source of input signals to receive the input signals therefrom; and adjustable means connected to said drain electrode for adjusting the drain current through said field effect transistor to control the gate-source voltage characteristics as a function of temperature.

2. The subcarrier oscillator defined in claim 1 wherein said input means includes a transistor having a first electrode connected to a reference potential, a base electrode connected to said source of input signals and a third electrode, said input means further including a resistive component and means connecting one terminal of said resistive component to said third electrode and the other terminal to the gate electrode of said field effect transistor.

3. A subcarrier oscillator for providing an output frequency as a function of the magnitude of an input signal from a source of input signals comprising:

an astable multivibrator including a pair of transistors each having emitter, base and collector electrodes regeneratively coupled in a multivibrator circuit for providing an output frequency as a function of the potential difference between the base and emitter electrodes of each of said transistors; and input means coupled to the base electrodes of said transistors and responsive to an input signal for adjusting said potential difference so that the output frequency is substantially a function of the input signal over a predetermined temperature range, said input means including a field effect transistor having gate, source and drain electrodes, means for connecting said gate electrode to receive said input signal and means for coupling the base electrodes of said first and second transistors to said source electrode, and adjustable means coupled to said drain electrode for controlling the drain current in said field effect transistor.

4. The subcarrier oscillator defined in claim 3 including means connecting the emitter electrodes of said first and second transistors to a first reference potential, means connecting the collector electrodes of said first and second transistors to a second reference potential at a predetermined potential difference from said first reference potential for providing collector voltage to said transistors, the source voltage at the source electrode of said field effect transistor being the base voltage of said transistors, said adjustable means coupled to the drain electrode of said field effect transistor including a drain current control transistor having collector, base and emitter electrodes, means connecting the collector and base electrodes to the source and drain electrodes of said field effect transistor respectively, an adjustable drain resistor connected between the drain electrode of said field effect transistor and a third source of reference potential and means coupled to said third source of reference potential and the emitter electrode of said drain current control transistor for controlling the potential at said emitter electrode with respect to the potential of said third source.

5. The subcarrier oscillator of claim 4 wherein said input means includes high impedance means disposed between said source of input signals and the gate electrode of said field effect transistor for minimizing the current loading of said source.

6. The subcarrier oscillator of claim 5 further including voltage regulating means for providing temperature compensated collector voltage to said transistors, and a regulated reference potential to said high impedance means, said latter mentioned means including an input transistor, first and second resistors, means connecting said first and second resistors in series between an emitter electrode of said input transistor and said regulated reference potential, means connecting the junction between said first and second resistors to the gate electrode of said field effect transistor, the collector electrode of said input transistor being connected to said first reference potential and the base electrode thereof being coupled to receive the input signal from said source of input signals.

7. In a subcarrier oscillator of the type including an astable multivibrator having having a pair of regeneratively coupled transistors for providing output frequencies as a function of input signals from a source of signals an improved temperature compensation arrangement for minimizing the affect of temperature variation within a predetermined temperature range on the output frequencies of said multivibrator so that the output frequency thereof is substantially only a function of the input signal thereto, the arrangement comprising:

an input buffer disposed between said source of input signals and said multivibrator and including a field effect transistor having gate, source and drain electrodes, means connecting said gate electrode to said source of input signals and said source electrode to said multivibrator, and adjustable drain current control means connected to said drain electrode for compensating for the collector emitter saturation voltage variations of the pair of transistors of said multivibrator by adjusting the drain current in said field effect transistor.

8. The subcarrier oscillator of claim 7 wherein said adjustable drain current control means includes a drain resistor coupled between the drain electrode of said field effect transistor and a voltage source, a transistor having base, emitter and collector electrodes, a Zener diode coupled between said emitter electrode and said voltage source, and means for coupling the base and collector electrodes to the drain and source electrodes of said field effect transistor.

9. The subcarrier oscillator of claim 7 wherein said means connecting said gate electrode to said source of input signals includes an input transistor having base, emitter and collector electrodes, a pair of resistors connected in series between the emitter electrodes and a voltage source which is at a predetermined potential with respect to a reference potential, means connecting the gate electrode of said field effect transistor to the junction point between said pair of resistors and means for connecting the collector and base electrodes of said input transistor to said reference potential and said source of input signals respectively.

References Cited

UNITED STATES PATENTS 3,246,258 4/1966 Boreen ------------ 331—176

ROY LAKE, *Primary Examiner.*

JOHN KOMINSKI, *Examiner.*